United States Patent [19]

Palara et al.

[11] Patent Number: 5,636,097
[45] Date of Patent: Jun. 3, 1997

[54] PROTECTIVE CIRCUIT FOR SEMICONDUCTOR POWER DEVICE

[75] Inventors: Sergio Palara; Stefano Sueri, both of Catania, Italy

[73] Assignee: Consorzio Per la Ricerca Sulla Microelettronica, Nel Mezzogiorno, Italy

[21] Appl. No.: 469,379

[22] Filed: Jun. 6, 1995

Related U.S. Application Data

[62] Division of Ser. No. 332,451, Oct. 31, 1994, abandoned.

[30] Foreign Application Priority Data

Oct. 31, 1994 [IT] Italy .................. MI91A1266

[51] Int. Cl.⁶ .................. H02H 3/00
[52] U.S. Cl. .................. 361/101; 361/93; 361/98; 257/355
[58] Field of Search .................. 361/93, 94, 98, 361/100, 101, 57, 18; 257/355

[56] References Cited

U.S. PATENT DOCUMENTS

| | | | |
|---|---|---|---|
| 4,562,454 | 12/1985 | Schultz et al. | 361/57 |
| 4,721,869 | 1/1988 | Okado | 361/89 |
| 4,937,697 | 6/1990 | Edwards et al. | 361/18 |

FOREIGN PATENT DOCUMENTS

| | | |
|---|---|---|
| 0260120 | 3/1988 | European Pat. Off. . |
| 0343536 | 11/1989 | European Pat. Off. . |
| 0396167 | 7/1990 | European Pat. Off. . |
| 61-135159 | 6/1986 | Japan . |
| 1018238 | 1/1989 | Japan . |

OTHER PUBLICATIONS

Siemens forshungs–Und Entwicklungsberichte, vol. 17, 1988 Berlin Germany, pp. 27–34, G. Miller, APorst, H. Strack, "SIRET ®, a 1000v Bipolar Transistor with no Two–Dimensional Parasitic Effects".

*Primary Examiner*—Jeffrey A. Gaffin
*Assistant Examiner*—Sally C. Medley
*Attorney, Agent, or Firm*—Felsman, Bradley, Gunter & Dillon, LLP

[57] ABSTRACT

A circuit is provided for protecting against an increase in collector current for an integrated circuit containing a power switching device. The power device drives an inductive load connected to a power supply, and is connected to a control circuit for switching the power device on and off. The protection circuit contains a clamping circuit for deactivating the control circuit and switching the power device off when the current flowing through the power device reaches a preset maximum value. In addition, a circuit is provided for inhibiting the operation of the clamping circuit for a preset time interval after the power device has been switched on, and for keeping the clamping circuit in operation during voltage undershoots caused by the inductive load following the switching of the powered device off.

7 Claims, 3 Drawing Sheets

PROTECTIVE CIRCUIT FOR SEMICONDUCTOR POWER DEVICE

This is a Division of application Ser. No. 08/332,451, filed Oct. 31, 1994 now abandoned.

BACKGROUND OF THE INVENTION

1. Technical Field

The present invention relates generally to semiconductor power devices, and more specifically to a circuit for protecting against an increase in output current for an integrated circuit power device driving an inductive load.

2. Description of the Prior Art

In electronic ignition systems for internal combustion engines, an ignition coil constitutes an inductive load. A semiconductor power switching device, normally a transistor, is used to drive the inductive load. The switching device is controlled using input voltage impulses having a duration such as to allow the current passing through the coil to reach a predetermined value.

The switch's input voltage can vary between a low value and a high value. In a typical application, a low input voltage causes the switch to be open, and a high input voltage closes the switch, thus allowing current to pass through the coil. If the switch is a bipolar transistor, so long as the input voltage is low the transistor's collector current is substantially zero and the transistor is off. In this event, the transistor behaves like an open switch. When the input voltage goes high, the transistor is on and behaves like a closed switch. As the input voltage goes high, the transistor's collector current, which is the power device's output current, starts to rise in a linear manner.

If, for accidental reasons, the input voltage continues to remain high beyond the expected time, the transistor remains on. Since the semiconductor switch continues to thus remain closed, the collector current consequently continues to rise. In this case, the collector current is limited only by the series resistance of the coil's primarily winding and of the switch. Such an enormous increase in the collector current causes an unacceptable current dissipation in the transistor, typically destroying it.

The transistor can also be destroyed by making use of the traditional method used in electronic ignition systems of limiting the collector current to a maximum preset value. In this case, the transistor falls out of saturation, thereby operating in the linear zone, and consequently almost all of the coil's supply voltage falls across the transistor itself. This causes a power dissipation that can destroy the transistor in only a few seconds.

A known method for protecting the power transistor is that is switching it off when the collector current reaches a preset value. This switching is performed independently of the fact that the input control voltage continues to remain high for an indefinite time. In such case, the protection circuit provides a clamping, or latch, circuit which uses a comparator to sense that the power transistor's collector current has reached a maximum value. The protection circuit then places itself in a state wherein it operates a control circuit of the power transistor, causing the transistor itself to be switched off.

The clamping circuit then remains in this state, ignoring other inputs that might reach it from the comparator, until it is reset to its primary state by a signal obtained from the input voltage when this goes low.

When this protection circuit is fabricated in the form of an integrated circuit on the same silicon chip as the power transistor and the protection circuit, considerable operating problems can be exhibited. An example of a technology which allows such construction is a vertical flow structure known as VIPower, available in products manufactured by SGS-Thomson Microelectronics. During switching of the power transistor, or Darlington if such is provided, the collector of the transistor itself has its voltage potential driven to a few volts below ground. This leads, consequently, to the switching on of vertical parasitic transistors inherent in the technological structure of the integrated protection circuit.

Obviously, the switching on of the parasitic transistor jeopardizes the correct operation of the protection circuit if it is indeed formed using an integrated technology as described above. This occurs because there is a clamping, or latch, circuit within the protection circuit, and switching on the parasitic transistors can, in fact, cause the erasure of the information stored in the clamping circuit itself. As a consequence, the protection circuit described above does not solve the problem of the destruction of the power transistor when the circuit itself is fabricated in an integrated form with the power transistor.

To understand this concept better, it is useful to consider the following typical example. As an initial condition, the input voltage is low and the power transistor is off. The voltage across the power transistor's collector is equal to the supply voltage, and the voltage applied across the ignition coil is zero. No current flows through the coil primary.

When the input voltage goes high, the power transistor is switched on and the voltage across its collector is equal to the saturation voltage. After a first interval of perhaps some 50 microseconds, depending on the particular features of the ignition coil, there is a first voltage undershoot (i.e., a voltage transient below ground) that lasts approximately ten microseconds. After this time, the collector voltage of the power transistor again becomes positive and equal to the saturation voltage. When the collector current reaches a preset maximum value, the clamping circuit intervenes and switches off the power transistor's control circuit. This causes the collector current to be cut off, and an overvoltage is created across the power transistor's collector that causes a spark on the coil's secondary. During the discharge of the secondary coil, the collector voltage maintains a value that is intermediate between the supply voltage and ground. When the discharge is over, which typically occurs after a second interval approximately two milliseconds from the time the collector current is switched off, there is a second collector voltage undershoot. In a typical case, this second undershoot lasts approximately ten microseconds.

If the protection circuit is fabricated in a single integrated device with the power transistor, the following problems occur during operation of the protection circuit. After the first time interval the clamping circuit must be inactive. However, the first undershoot of the power transistor's collector voltage can activate the clamping circuit and undesirably switch off the power transistor's control circuit. After the second time interval, the clamping circuit must be active even if the input voltage continues to remain high. Since a voltage undershoot occurs, the clamping circuit can lose the information that it had stored, and thereby reset itself. This would result in again switching on the control circuit.

It is therefore an object of the present invention to provide a protection circuit which can be fabricated in an integrated form with a power device. It is another object to provide such a circuit while avoiding the drawbacks mentioned above.

SUMMARY OF THE INVENTION

Therefore, according to the present invention, a circuit is provided for protecting against an increase in collector current for an integrated circuit containing a power switching device. The power device drives an inductive load connected to a power supply, and is connected to a control circuit for switching the power device on and off. The protection circuit contains a clamping circuit for deactivating the control circuit and switching the power device off when the current flowing through the power device reaches a preset maximum value. In addition, a circuit is provided for inhibiting the operation of the clamping circuit for a preset time interval after the power device has been switched on, and for keeping the clamping circuit in operation during voltage undershoots caused by the inductive load following the switching off of the power device.

BRIEF DESCRIPTION OF THE DRAWING

The features of the present invention shall be made more evident by an embodiment illustrated as a non-limiting example in the enclosed drawings, wherein.

DETAILED DESCRIPTION OF PREFERRED EMBODIMENT

In summary, the advantages of the present invention are realized in a preferred embodiment of a circuit for protection against an increase of output current for an integrated circuit including a power switching device. The power transistor device drives an inductive load connected to a power supply. A control circuit is provided for switching the power device on and off, and has an impulse input voltage variable between a deactivation state and an activation state of the control circuit. A protection circuit includes a clamping circuit suitable for deactivating the control circuit and switching off the power device when the current flowing through the power device reaches a preset maximum value. The protection circuit also includes a first circuit means suitable for inhibiting the operation of the clamping circuit for a preset time interval after the power device has been switched on. Such time interval preferably lasts at least until the end of a first voltage undershoot of the power device's supply voltage caused by the inductive load as a result of switching the power device on. Also included is a second circuit means which operates to keep the clamping circuit in operation during a second voltage undershoot caused by the inductive load following switching the power device off. In this manner, the protection circuit is not adversely affected by disturbances due to the voltage undershoots of the power device's supply voltage, and it operates correctly.

Figure 1:
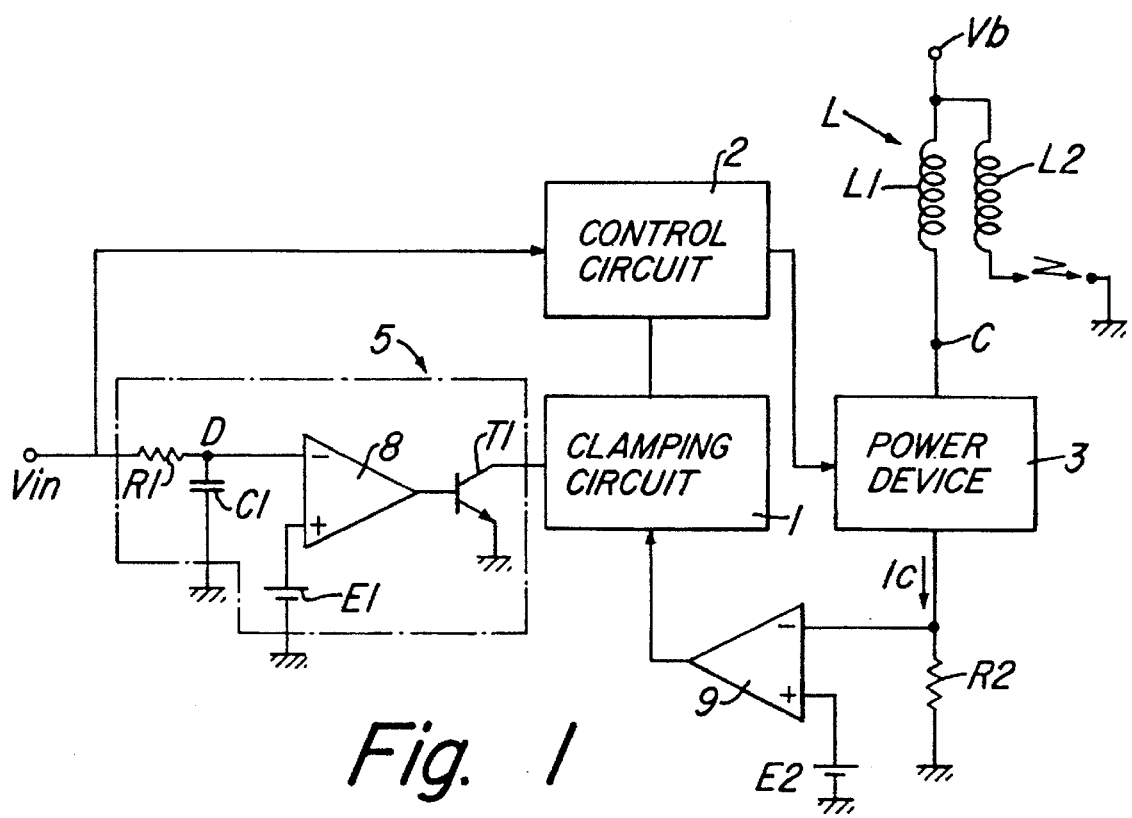
FIG. 1 illustrates a circuit diagram according to the present invention.

Referring to FIG. 1 a clamping circuit 1 is connected to a control circuit 2 that switches a power device 3 on and off. The power device 3 can be, for example, an NPN type bipolar transistor, and in turn drives inductive load L connected to a battery power supply Vb. The inductive load is, for example, an ignition coil for an internal combustion engine (not shown), and has a primary winding L1 and a second winding L2.

The control circuit 2 has an input voltage signal Vin. Vin is a pulse input signal that varies between a low value and a high value. When Vin is low, control circuit 2 is deactivated, and when Vin is high control circuit 2 is activated.

A first circuit means S is interposed between the input Vin and the clamping circuit 1. Circuit means 5 operates to inhibit operation of the clamping circuit 1 for a preset time interval after a high voltage is reached at the input Vin. The first circuit means 5 includes an RC network consisting of a resistor R1 and a capacitor C1 connected to a node D. A comparator 8 has an input connected to node D, and another input connected to a threshold voltage generator E1. An NPN transistor T1 has its base connected to the output of comparator 8. The emitter of transistor T1 is connected to ground, and the collector is connected to an input of the clamping circuit 1.

Between the power device 3 and the clamping circuit 1 is a comparator 9. Comparator 9 operates to activate the clamping circuit 1 when the current flowing through the power device 3 reaches a maximum value of Icmax. One input of the comparator 9 is connected to a reference voltage generator E2 while the other input is connected to a node intermediate between the power device 3 and a detection resistor R2. The other end of R2 is grounded.

Figure 2:
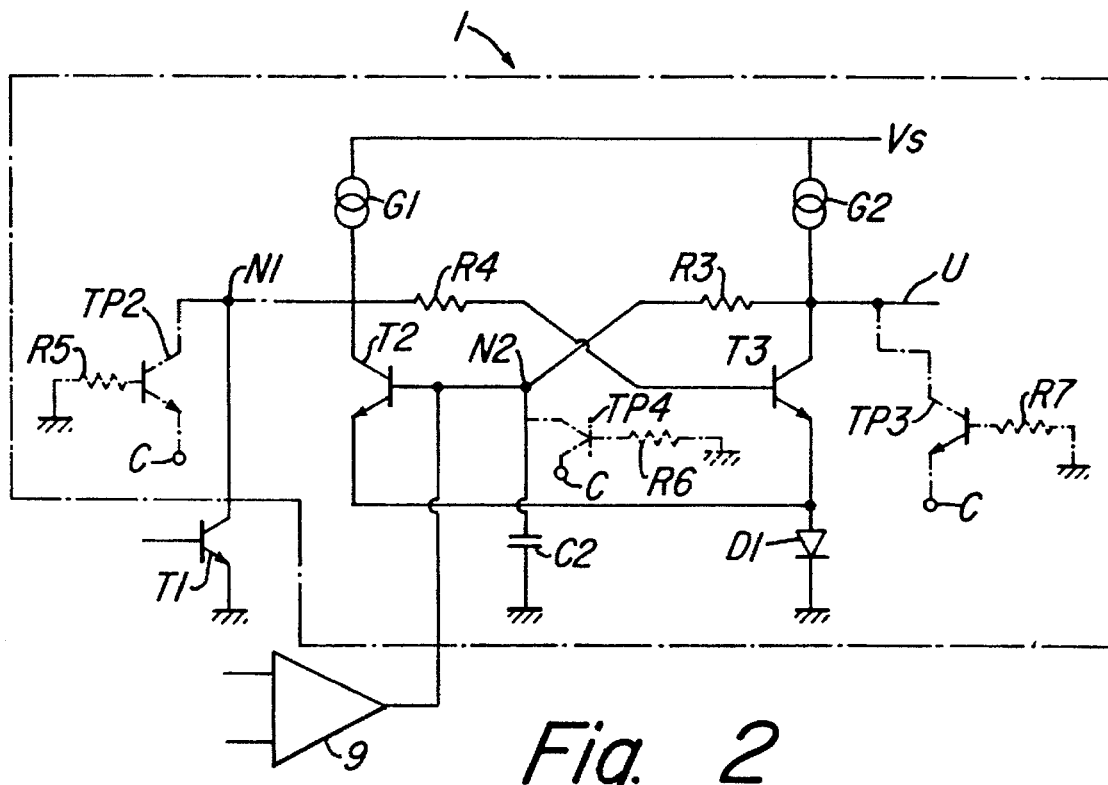
FIG. 2 illustrates a preferred embodiment of a clamping circuit included in the protection circuit illustrated in FIG. 1.

With reference to FIG. 2, a preferred embodiment is shown for the clamping circuit 1 of FIG. 1. Clamping circuit 1 contains an input transistor T2 and an output transistor T3 with the emitters connected together and to ground through a diode D1. In the preferred embodiment, transistors T2 and T3 are NPN transistors. The collectors of transistors T2, T3 are connected to a supply voltage Vs through current generators G1, G2. The base of input transistor T2 is connected to the output of comparator 9 and to the collector of transistor T3 as well through a resistor R3. The collector of transistor T3 is connected to the output U of the clamping circuit 1. The base of transistor T3 is connected through a resistor R4 to the collector of transistor T2 and to circuit node N1. Node N1 represents an input of the clamping circuit 1, and is connected to the collector of transistor T1. A second capacitor 02 has one end grounded and the other end connected to a node N2, which lies between resistor R3 and the base of input transistor T2.

When fabricating the clamping circuit 1 and the power device 3 in a single integrated circuit, parasitic transistors TP2, TP3, and TP4 are formed. These parasitic transistors are indicated in FIG. 2 with dotted lines. Fabrication of the clamping circuit 1 and power device 3 in a single circuit will be described later with reference to FIG. 3.

In FIG. 2, the emitters of the parasitic transistors TP2, TP3, and TP4 are connected to a terminal C of the power device 3, which is essentially the collector of the NPN power transistor. The bases of the parasitic transistors are connected to ground through resistances R5, R6, and R7. The collector of transistor TP2 is connected to the collector of input transistor T2. The collector of transistor TP3 is connected to the collector of the output transistor T3, and the collector of transistor TP4 is connected at the circuit node M2 to the base of the input transistor T2.

Figure 3:
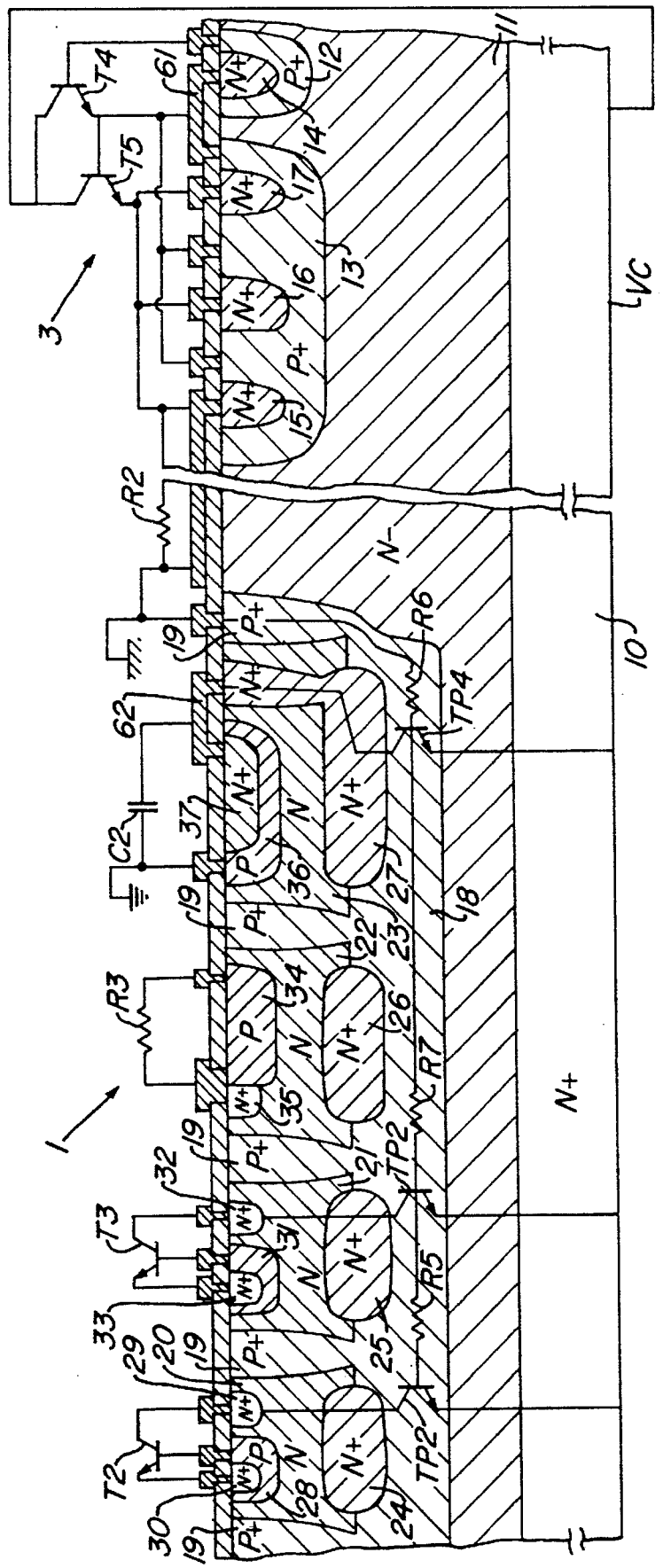
FIG. 3 is a cross-sectional view of a preferred embodiment of an integrated circuit containing a protection circuit according to the present invention.

To better explain the existence of the parasitic transistors, FIG. 3 illustrates a portion of an integrated circuit which includes the clamping circuit 1 and the power device 3. On an N+substrate 10 is an epitaxial layer 11 doped N−. Substrate 10 forms the collector of the power device 3, and is at voltage Vc. Within the epitaxial layer 11 is a P+ type region 12 which forms the base of transistor T4. Transistors T4 and T5 are connected in a Darlington configuration, and together form the power device 3. Inside region 12 is an N+ type region 14 which forms the emitter of transistor T4, and which is connected through a surface metallization 61 to the P+ base region 13 of transistor TS. Base region 13 contains N+ type regions 15, 16, and 17 which form the emitter of transistor T5. The collectors of the transistors T4 and T5, connected together, are formed by the substrate 10. Metallization resistance R2 is connected between ground and the emitters of the transistors T4 and T5.

Within the spitaxial layer 11 there is also formed an isolation well 18 which is P type, and which extends to the surface with P+ type vertical regions 19. N type epitaxial regions 20, 21, 22, 23 are formed between the vertical regions 19. Enriched N+ type regions 24, 25, 26, and 27 are formed between the P type deep region 18 and the N type regions 22, and 23. N type region 27 extends to the surface of the semiconductor as shown.

type region 2S and N+ type region 29 are formed inside region 20. Within region 28 is formed N+ type region 30. The regions 28, 29, and 30 constitute the base, collector, and emitter of the input transistor T2. The region 29, the substrate 10, and the region 18 define the collector, the emitter, and the base of the parasitic transistor TP2 which is formed in association with the transistor T2.

P type region 31 and N+ type region 32 are formed inside the region 21. N+ type region 33 is formed within region 31. The regions 31, 32 and 33 define the base, collector, and emitter of the output transistor T3. The region 32, the substrate 10, and the region 18 represent the collector, emitter, and the base of the parasitic transistor TP3 associated with the transistor Region 22 contains P type region 34 and N+ type region type 35, which together are suitable for defining the diffused resistance R3. Similar regions elsewhere in the circuit (not shown) are suitable for constituting the diffused resistance R4.

Within region 23 are formed P type region 36 and N+ type region 37. The regions 36 and 37 together define the capacitor C2. A surface metallization 62 connects the region 37 to the adjacent region 27.

The N+ type region 27 represents the collector of parasitic transistor TP4, which is associated with the capacitor C2. The emitter of parasitic transistor TP4 is constituted by the substrate 10, while the base is formed by the P type region 18. Parasitic transistor TP4 is such as to form a high-voltage transistor having a breakdown voltage that is higher than that which appears across the primary (L1) of the coil L. The base resistances R5, R7, and R6 of the parasitic transistors TP2, TP3, and TP4 are also defined within region 18. Diode D1 is not shown in FIG. 3, but is connected between the emitter region 33 of output transistor T3 and ground as known in the art.

Figure 4:
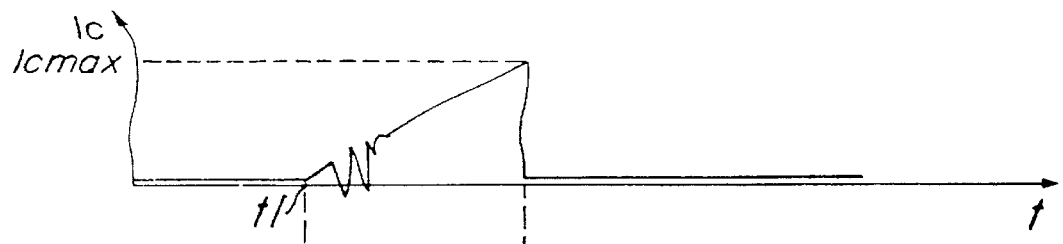
FIGS. 4-7 illustrate selected waveforms present during operation of the circuit of FIG. 1.
Figure 5:
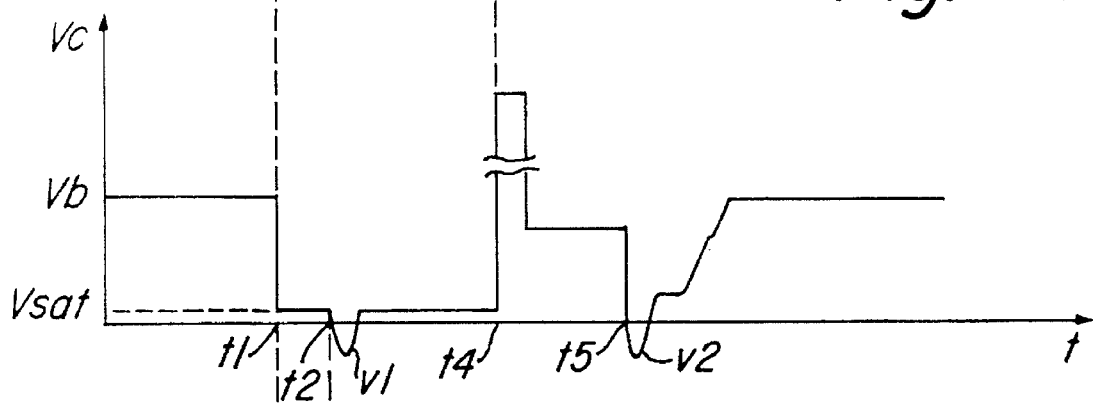
Figure 6:
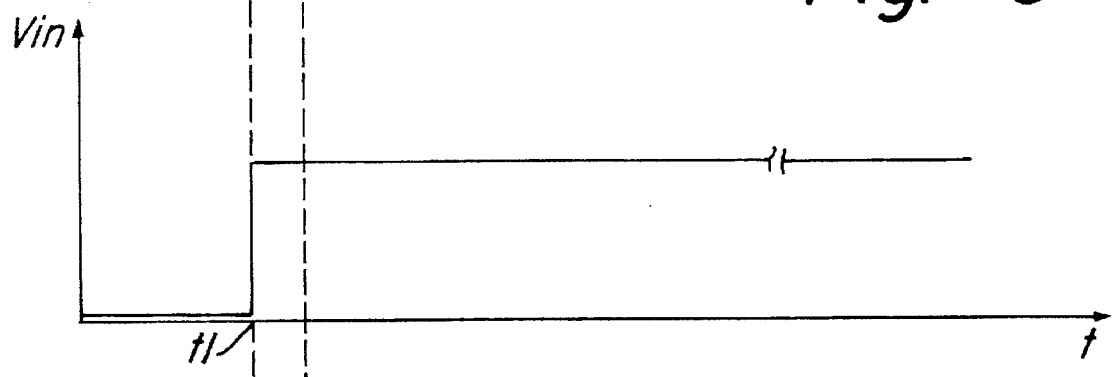
Figure 7:
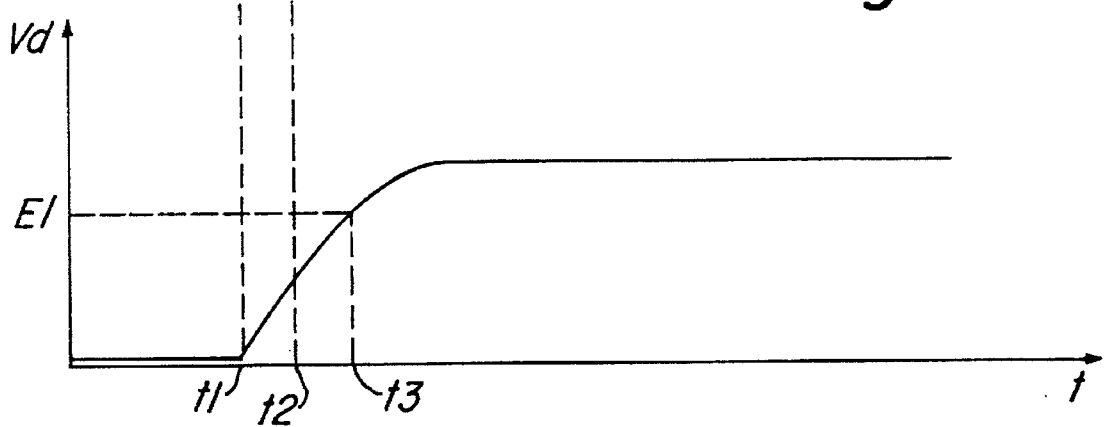

With reference to FIGS. 1 and 2, and keeping in mind the parasitic transistors inherent in the integrated structure of FIG. 3, operation of the circuits of the invention occurs as will now be described. In connection with such description, current wave form Ic is shown in FIG. 4, and the voltage Vc on the collectors of the power transistors T4 and T5 is shown in FIG. 5. The input voltage Vin is shown in FIG. 6, and the voltage Vd, found at circuit node D connected to the input of comparator 8 is shown in FIG. 7.

Initially Vin is low, the clamping circuit 1 with output U high is off, the control circuit 2 is inactive, and the power device 3 is off. The voltage Vc across the collector of power device 3 is equal to the voltage Vb of the supply battery. The current Ic through the collector of the power device 3 is zero.

When the input Vin goes high at time t1, the control circuit 2 is activated and switches on the power device 3. The voltage Vc across the collector of power device 3 moves to the saturation voltage Vsat. The current Ic on the collector of the power device 3 begins to rise. In the meantime, the voltage Vin starts charging the first capacitor C1. Since the voltage across capacitor C1 is less than E1, comparator 8 continues to keep transistor T1 switched on. The low output of transistor T1 keeps clamping circuit 1 inhibited.

At time t2, a first voltage undershoot, with peak voltage V1, occurs on the collector of power device 3. This undershoot has a duration equal to approximately ten microseconds. This causes the parasitic transistors TP2, TP3, and TP4 to be switched on with the resulting drop to a low level of the output voltage of clamping circuit 1, which should be on.

But the time t2, added to the duration of the first voltage undershoot, is less than that which the capacitor C1 takes to charge itself to the voltage E1. This charging time is shown as time t3. Thus, the comparator 8 continues to keep the transistor T1 switched on, and through transistor T1 to keep the clamping circuit 1 inhibited.

Approximately ten microseconds after T2, the voltage Vc rises again above ground. The output voltage U of the clamping circuit 1 is high, so that clamping circuit 1 is off. As a consequence, clamping circuit 1 does not cause the control circuit 2 to cut off the power device 3.

This occurs since parasitic transistors TP2, TP3, and TP4 are switched off, while transistor T1 is switched on up to the time t3. While T1 is switched on, T3 is switched off, so that the voltage U is high and the clamping circuit 1 is off. The high voltage U causes the resulting conduction of transistor T2, whose low collector voltage continues to keep transistor T3 switched off, and thus U high.

At time t3, which is greater than the sum of time t2 and the time interval of the first voltage undershoot at the collector of power device 3, the voltage across capacitor C1 reaches the value E1. The comparator 8 is triggered and turns the transistor T1 off. The state of clamping circuit 1 remains unchanged.

From this time forward, the clamping circuit 1 is no longer inhibited. Clamping circuit 1 will now switch itself on as the result of a switch-on command received from the comparator 9. When the current value Icmax is reached, at time t4, the comparator 9 is triggered and causes the clamping circuit 1 to be switched on.

When this occurs, the output of the comparator 9 drives the base of the input transistor T2 low and thus switches it off. As a result, the output transistor T3 is switched on and the output U of the clamping circuit 1 goes low. The output U in turn, acts on the control circuit 2 which switches the power device 3 off. At this point, the clamping circuit 1 has reached the active state, and continues to remain in such a state for the entire time in which the input voltage Vin remains high. The clamping circuit remains in this state independently of any disturbances on the power supply, which are reflected on the collector of power device 3. An example of such a disturbance is shown in the curve Vc in FIG. 5, and occurs at time t5.

At that time, the occurrence of a second voltage undershoot at a voltage V2 causes the parasitic transistors TP2, and TP3 to conduct. These force the voltage across the output U to remain low. TP4 is also activated, which is the parasitic transistor for the capacitor C2. During this second voltage undershoot, the capacitor e2 discharges through the parasitic transistor TP4.

After approximately ten microseconds the second voltage undershoot is exhausted, but the clamping circuit 1 continues to maintain the state of U low. Capacitor C2 makes a contribution to the maintenance of the low value of U. The clamping circuit 1 has a preferential state of a low U output until the capacitor C2, coincident with the base of input transistor T2, has been charged to a voltage equal to 2Vbe= (Vbe (T2) +Vbe (D1)).

During this step, the diode D1 is used to increase the switch-on threshold of the transistor T2 from 1Vbe to 2Vbe. This increases the safety margin to maintain transistor C2 off even considering the fact that capacitor C2 takes longer to charge itself at 2Vbe than at 1Vbe.

Before the capacitor C2 charges itself through the voltage U and resistor R3 at a voltage value equal to 2Vbe, the input transistor T2 switches off. This results in a transistor T3 being switched on, keeping U low. The capacitor C2 and its charging resistor R3 are selected to be of such a size that the charging of C2 takes place in a time greater than the duration of the second voltage undershoot.

Once the capacitor C2 has charged itself to a voltage equal to (Vbe(D1)+Vsat(T3)), after the second voltage undershoot is over, the clamping circuit 1 is not disturbed. Clamping circuit 1 remains with transistor T3 switched on and output U low. This occurs because the voltage across capacitor C2 is less than the minimum voltage necessary to trigger transistor T2, which is (Vbe(T2)+Vbe(D1)). In this manner, the circuit described above is not affected by disturbances due to transient voltage undershoots and operators correctly.

While the invention has been particularly shown and described with reference to a preferred embodiment, it will be understood by those skilled in the art that various changes in form and detail may be made therein without departing from the spirit and scope of the invention.

What is claimed is:

1. Circuit for protection against an increase in output current for an integrated circuit having a power device driving an inductive load connected to a power supply and a control circuit for switching said power device. on and off, and having a deactivation input voltage variable between a deactivation state and an activation state of said control circuit, said protecting circuit comprising:

a clamping circuit suitable for deactivating said control circuit and switching the power device off when the current flowing through said power device reaches a preset maximum value, wherein the protection also includes a first circuit means for inhibiting the operation of said clamping circuit for a preset time interval after the power device has been switched on, said time interval lasting at least until the end of a first voltage undershoot of the power device's supply voltage caused by the inductive load due to said switching on of the power device, and a second circuit means for keeping said clamping circuit in operation during a second voltage undershoot of said supply voltage caused by said inductive load following said switching off of the power device, wherein said second circuit means comprise a condenser in an N+/P junction located in an epitaxial region contained within an insulation well of the type P in turn contained in an epitaxial layer of the type N– grown on a substrate of the type N+, and an NPN transistor having as the collector an enriched region of the type n+ of said epitaxial region, as the base said insulation well of the type P and as the emitter said epitaxial layer and an underlying substrate, said collector of said NPN transistor being connected by said condenser.

2. Integrated structure according to claim 1, characterized in that said NPN transistor is a high-voltage transistor having a breakdown voltage that is higher than that which appears across said inductive load.

3. The circuit according to claim 1, wherein the clamping circuit comprises between an input and an output, an input transistor and an output transistor across whose collector a high or low output is taken in the case of the clamping circuit being off or on, wherein the input transistor includes a base formed by a first P- type region and a collector formed by a first N+ type region, both regions being formed within a first N type epitaxial region, and an emitter formed by a second N+ type region within the first P type region; and wherein the output transistor comprises a base formed by a second P type region, a collector formed by a third N+ type region, both regions being formed within a second N type epitaxial region, and an emitter formed by a fourth N+ type region formed within the second P type region.

4. The circuit according to claim 3, wherein the first N type epitaxial region and the second N type epitaxial region are contained within a P type insulation well contained in a N type epitaxial layer grown on a N+ substrate.

5. The circuit according to claim 3 further comprising a resistor including a first end formed by a third P type region and a second end formed by a fifth N+ type region, both regions being adjacent to each other and contained within a third N type epitaxial region, wherein the first end of the resistor is connected to the base of the input transistor and the second end is connected to the collector of the output transistor.

6. The circuit according to claim 5 further comprising a second resistor including a first end formed by a fourth P type region and a second end formed by a sixth N+ type region, both regions being adjacent to each other and contained within a fourth N type epitaxial region, wherein the second resistor forms a connection between the base of the output transistor and the collector of the input transistor.

7. A circuit for protection against an increase in output current for an integrated circuit including a power device having a power supply electrode connected to a power supply through an inductive load and a control circuit for switching said power device on and off according to a control circuit input voltage variable between a control circuit deactivation state and a control circuit activation state, the protection circuit comprising:

a clamping circuit suitable for causing the control circuit to switch the power device off when the maximum current flowing through the power device reaches a preset maximum value, wherein the protection also includes a first circuit means for inhibiting the operation of the clamping circuit for a preset time interval after the power device has been switched on, the time interval lasting at least until the end of a first voltage undershoot on the power supply electrode of the power device caused by the inductive load due to the switching on of the power device, and a second circuit means for keeping the clamping circuit in operation during and after a second voltage undershoot on the power supply electrode caused by the inductive load following the switching off of the power device, wherein said second circuit means comprise a condenser in an N+/P junction located in an epitaxial region contained within an insulation well of the type P in turn contained in an epitaxial layer of the type N-grown on a substrate of the type N+, and an NPN transistor having as the collector an enriched region of the type n+ of said epitaxial region, as the base said insulation well of the type P and as the emitter said epitaxial layer and an underlying substrate, said collector of said NPN transistor being connected by said condenser.

* * * * *

UNITED STATES PATENT AND TRADEMARK OFFICE
CERTIFICATE OF CORRECTION

PATENT NO.  : 5,636,097
DATED       : June 3, 1997
INVENTOR(S) : Sergio Palara and Stefano Sueri It is certified that error appears in the above-indentified patent and that said Letters Patent is hereby corrected as shown below:

On the title page: Item [30]  please change the Priority Date to read May 9, 1991 instead of October 31, 1994.

Item [75]  please amend the name and address of the Applicant to read as follows:
Consorzio Per La Ricerca Sulla Microelettronica Nel Mezzogiorno, Catania, Italy.

In Column 1, line 5, please insert after the word abandoned --, which is a continuation of the original application Serial No. 07/880,497 filed on May 8, 1992, now abandoned.--

Signed and Sealed this

Thirtieth Day of March, 1999

*Attest:*

Q. TODD DICKINSON

*Attesting Officer*     *Acting Commissioner of Patents and Trademarks*